(12) United States Patent
Iwasaki et al.

(10) Patent No.: US 8,742,872 B2
(45) Date of Patent: Jun. 3, 2014

(54) MEMS ELEMENT, AND MANUFACTURING METHOD OF MEMS ELEMENT

(75) Inventors: Tomohiro Iwasaki, Shiga (JP); Keiji Onishi, Osaka (JP); Kunihiko Nakamura, Osaka (JP)

(73) Assignee: Panasonic Corporation, Osaka (JP)

( * ) Notice: Subject to any disclaimer, the term of this patent is extended or adjusted under 35 U.S.C. 154(b) by 413 days.

(21) Appl. No.: 13/322,990

(22) PCT Filed: Feb. 24, 2011

(86) PCT No.: PCT/JP2011/001051
§ 371 (c)(1),
(2), (4) Date: Nov. 29, 2011

(87) PCT Pub. No.: WO2011/114628
PCT Pub. Date: Sep. 22, 2011

(65) Prior Publication Data
US 2012/0075030 A1    Mar. 29, 2012

(30) Foreign Application Priority Data
Mar. 18, 2010   (JP) .................. 2010-062187

(51) Int. Cl.
| | | |
|---|---|---|
| H03H 9/02 | (2006.01) |
| H03H 9/10 | (2006.01) |
| H03B 5/30 | (2006.01) |
| H03H 3/007 | (2006.01) |
| H01L 21/62 | (2006.01) |
| H01L 23/02 | (2006.01) |
| H03H 9/24 | (2006.01) |
| B81B 3/00 | (2006.01) |
| B81B 7/00 | (2006.01) |
| B81C 1/00 | (2006.01) |

(52) U.S. Cl.
CPC .......... *H03H 9/1057* (2013.01); *H03H 9/2405* (2013.01); *H03H 9/2447* (2013.01); *H03H 3/0072* (2013.01); *B81B 3/00* (2013.01); *B81B 7/0077* (2013.01); *B81C 1/00333* (2013.01); *B81C 1/00476* (2013.01)
USPC .... 333/186; 333/200; 257/415; 257/E21.219; 331/156; 310/309; 438/51; 438/689; 438/738

(58) Field of Classification Search
CPC .......... H03H 9/02244; H03H 9/02433; H03H 9/1057; H03H 9/2045; H03H 9/2426; H03H 3/0072; H03H 3/0073; B81B 3/00; B81B 3/0013; B81B 3/0016; B81B 3/0097; B81B 7/0054; B81B 7/0077; B81B 2003/0109; B81B 2003/0118; B81B 2003/04; B81B 2007/99; B81C 1/00; B81C 1/00134; B81C 1/00142; B81C 1/00166; B81C 1/00182; B81C 1/00261; B81C 1/00325; B81C 1/00333; B81C 1/00476; B81C 1/00944; B81C 1/00984
USPC .................. 333/186, 187, 197–200; 310/309; 331/156; 438/48, 51, 689, 737, 738; 257/415, E21.219
See application file for complete search history.

(56) References Cited

U.S. PATENT DOCUMENTS

| | | | | |
|---|---|---|---|---|
| 7,358,648 | B2 | 4/2008 | Nakamura et al. | 310/333 |
| 7,557,441 | B2 * | 7/2009 | Pyo et al. | 257/704 |
| 7,948,043 | B2 * | 5/2011 | Kim et al. | 257/415 |
| 2002/0121841 | A1 | 9/2002 | Shimoe et al. | 310/313 B |
| 2004/0145056 | A1 | 7/2004 | Gabriel et al. | 257/758 |
| 2004/0178698 | A1 | 9/2004 | Shimoe et al. | 310/313 R |
| 2005/0000932 | A1 | 1/2005 | Gabriel et al. | 216/2 |
| 2006/0205106 | A1 | 9/2006 | Fukuda et al. | 438/52 |
| 2006/0267109 | A1 | 11/2006 | Ohguro | 257/396 |
| 2007/0290308 | A1 * | 12/2007 | Kim et al. | 257/678 |
| 2008/0029864 | A1 * | 2/2008 | Pyo et al. | 257/678 |
| 2009/0049911 | A1 | 2/2009 | Fukuda et al. | 73/514.32 |

| 2009/0064785 A1 | 3/2009 | Fukuda et al. ............. 73/514.32 |
| 2009/0090987 A1 | 4/2009 | Yoshikawa et al. ........... 257/415 |
| 2011/0315526 A1* | 12/2011 | Jahnes et al. ................. 200/181 |

FOREIGN PATENT DOCUMENTS

| CN | 1365187 | 8/2002 |
|---|---|---|
| JP | 2004-223708 | 8/2004 |
| JP | 2005-37309 | 2/2005 |
| JP | 2006-263902 | 10/2006 |
| JP | 2006-321016 | 11/2006 |
| JP | 2006-326806 | 12/2006 |
| JP | 2009-188785 | 8/2009 |
| JP | 2009-262301 | * 11/2009 |
| WO | 03/023849 | 3/2003 |
| WO | 2004/077523 | 9/2004 |

OTHER PUBLICATIONS

English translation of International Preliminary Report on Patentability issued Oct. 23, 2012 in International (PCT) Application No. PCT/JP2011/001051.

Chinese Office Action (OA) issued Nov. 5, 2013 in Chinese Patent Application No. 201180002256.0, together with English translation of pp. 1-2 thereof.

Chinese Search Report (SR) issued Nov. 5, 2013 in Chinese Patent Application No. 201180002256.0, together with English translation thereof.

International Search Report issued May 24, 2011 in International (PCT) Application No. PCT/JP2011/001051.

* cited by examiner

*Primary Examiner* — Barbara Summons

(74) *Attorney, Agent, or Firm* — Wenderoth, Lind & Ponack, L.L.P.

(57) ABSTRACT

In a MEMS device having a substrate 1, a sealing membrane 7, and a movable portion 3 of beam and an electrode 5 which have a region wherein they overlap with a gap in perpendicular to a substrate 1 surface, a first cavity 9 is on the side of the movable portion 3 in the direction perpendicular to the surface of the substrate, and a second cavity is the other cavity, and an inner surface a of a side wall A in contact with the electrode 5, of the first cavity 9, is positioned more inside than an inner surface b of a side wall B in contact with the electrode 5, of the second cavity 10, in the direction parallel to the substrate surface, such that the movable portion 3 does not collide with the electrode 5 when mechanical stress is applied from outside to the sealing membrane 7.

15 Claims, 7 Drawing Sheets

US 8,742,872 B2

MEMS ELEMENT, AND MANUFACTURING METHOD OF MEMS ELEMENT

TECHNICAL FIELD

The present invention is related to a MEMS ((Micro-Electro Mechanical Systems) device and particularly the MEMS device which achieves sealing of high reliability in a MEMS resonator having a micro-gap structure.

BACKGROUND ART

An example of a conventional MEMS resonator is described with reference to FIGS. 7 and 8. FIGS. 7 and 8 are a perspective view and a cross-sectional view showing a structure of the MEMS resonator as disclosed in Patent Literature 1, which is manufactured using a SOI (Silicon on insulator) substrate. This MEMS resonator is used in, for example, a filter, as described in Patent Literature 1. Here, the SOI substrate is a substrate manufactured by forming a device-forming layer of a single crystal silicon on a silicon substrate with a BOX layer of a silicon oxide film (Buried silicon oxide film) interposed therebetween.

In the manufacturing of the MEMS resonator shown in FIG. 7, anisotropic etching is firstly conducted in the SOI substrate to form a beam-like body having a triangular section (a beam of triangular section), the silicon oxide film for forming the gap is formed, and then an electrode 202 is formed. Subsequently, the silicon oxide for the gap and the BOX layer 206 are removed leaving a portion which is to be a support portion. Thereby, an aerial protruded structure portion is completed wherein the beam of the triangular section which is to be an oscillator 201 is released so that it is in a movable state and the electrodes having space (cavity) and narrow gaps are disposed on the side surfaces of the beam of the triangular section having a protruded structure.

As shown in FIG. 8, the space (cavity) 207 is formed under the oscillator 201. This manufacturing method achieves the MEMS resonator having the oscillator of the single crystal silicon wherein the SOI substrate is employed and the electrode terminals which enable electrostatic excitation and electrostatic detection. Since both of the film for forming the gap and the BOX layer 206 which corresponds to a lower layer portion underlying the oscillator 201 are the silicon oxide layer in this manufacturing method, the gap formation and the release of structure are made simultaneously in the final release (structure release) step, resulting in the decrease in the number of the manufacturing steps. Patent Literature 1 disclose a method of covering this resonator with a glass cap as a method for sealing this resonator.

A vibration-type pressure sensor having a conventional sealing structure is described with reference to FIG. 9. FIG. 9 is a cross-sectional view of the pressure sensor which is manufactured using a MEMS technique as described in Patent Literature 2. An oscillator 103 is a beam of single crystal silicon. A vacuum chamber 105 is formed by a sacrificial-layer etching technique which employs difference in etching rate, which difference caused by an impurity content in epitaxial grown silicon.

A shell 104 is also formed by a thin-film formation technique. Electrostatic capacitance is formed between the shell 104 and the beam (oscillator) 103. The beam is anchored to a measuring diaphragm at both ends and can be vibrated at around a resonant frequency. The device shown in FIG. 9 functions as the pressure sensor by catching change of stress in the beam due to the pressure applied to the measuring diaphragm as the change in resonant frequency.

A Q value representing sharpness of resonance of the beam deteriorates due to viscosity of the air around the beam. Therefore, a high Q value can be maintained by keeping the vacuum in the vacuum chamber. As the Q value is higher, the change in resonant frequency due to the pressure can be sensed more sensitively.

The pressure sensor described with reference to FIG. 9 can be manufactured by a method wherein the resonant beam is sealed in vacuum only by the thin-film formation processes. Thus, the manufacturing of this pressure sensor does no need the vacuum sealing step in a device-packaging process, enabling a small-sized pressure sensor to be provided at a low cost.

BACKGROUND ART DOCUMENT

Patent Literature

Patent Literature 1 U.S. Pat. No. 7,358,648
Patent Literature 2 JP 2005-37309 A

SUMMARY OF INVENTION

Problems to be Solved by Invention

The sealing technique using the thin-film formation process described in Patent Literature 2 can be applied not only to the pressure sensor, but also to the resonator, a filter, an oscillator, a switching device, a gyroscope, and a mass detection device which utilize the MEMS technique. The purpose of sealing is not only to maintain the oscillator in the movable state in vacuum. The technique described in Patent Literature 2 can be applied to a device which does not require the vacuum, for the purpose of isolating the device from humidity or dust outside the device, or protecting the inside of the sealing from a resin filling pressure upon packaging the device with resin transfer molding.

The sealing technique described in Patent Literature 2, however, cannot be directly applied to the MEMS resonator as described in Patent Literature 1. Thus, the sealing by the resin transfer molding which is conventionally used in the filed of semiconductor is considered as the sealing method. However, sealing the MEMS resonator described in Patent Literature 1 with the resin transfer molding has the following problems.

Specifically, there is a problem that a structure to be sealed (especially an electrode) itself is warped by a pressure applied from the outside during the resin transfer molding, causing collision of the electrode with a beam (a movable portion). In the MEMS resonator, a gap between the electrode and the beam (the oscillator) is required to be narrow so that device impedance is reduced. When the MEMS resonator described in Patent Literature 1 is used as a timing device for an electronic device, the gap is about 100 nm to about 200 nm. Such a narrow gap cannot be maintained under the pressure during the resin transfer molding.

In order to avoid such problem, there is a method wherein another sealing structure is made to form cavities above and under the electrode 305 and the movable portion (the oscillator) 303 as shown in FIG. 10. In FIG. 10, a numeral 301 denotes a substrate, 302 and 306 denote sacrificial layers, and 307 denotes a sealing membrane 307. The cavities are formed by removing the sacrificial layers 302 and 306 partially, whereby the remaining portions of the sacrificial layers 302 and 306 form side walls defining the cavities. The sealing structure can be given by the sealing membrane 307 according to this method. However, even if the structure shown in FIG. 10 is employed, the inventors have found the following problems in the case where this device is further sealed by the resin transfer molding.

Specifically, when "B" of the cavity on the electrode side is positioned more inside than a side wall A of the cavity on the movable-portion side, the pressure applied during the resin transfer molding is transmitted to the sealing membrane to transmit a force to the electrode through the side wall of the cavity. A direction in which the force is applied to the electrode is parallel to a thickness direction of the device. For this reason, the electrode is warped by the force applied to the electrode downwardly when the side wall of the cavity on the electrode side is positioned more inside than the side wall of cavity on the movable-portion side, that is, a space is situated under the side wall on the electrode side. As a result, the electrode is moved downwardly as shown in FIG. 10, which may cause the collision of the electrode with the movable portion.

FIG. 11 is a graph showing results of calculation relating to a distortion amount of the sealing membrane in the thickness direction when an external pressure is applied thereto. The respective lines show differences in the film thicknesses of the sealing membranes. As the film thickness is larger, the distortion amount is smaller. The pressure of about 1E+07 Pa (100 atm) to about 1.5E+07 Pa (150 atm) is applied to the sealing membrane during the resin transfer molding. For this reason, even when the thickness of the sealing membrane is thick such as 4 µm, the film is distorted by 300 nm under 150 atm.

The external pressure which causes such large distortion results in collision of the electrode with the movable portion. In other words, the MEMS resonator shown in FIG. 10 has a structure wherein the force applied to the sealing membrane is transmitted directly to the electrode, causing the warpage of the electrode. Therefore, when the gap between the electrode 305 and the movable portion 303 is about 100 nm to about 300 nm, the gap is not maintained in a hatching area in FIG. 11 resulting in collision of the electrode with the movable portion. The sealing membrane having the thickness of at least 6 µm to 7 µm is required to be used in order that the collision is avoided. However, the film of such thickness can be formed only by laminating many thin films as long as the current semiconductor thin film formation technique is applied, which includes another problem of low throughput.

Means to Solve the Problems

In order to solve the problems, the present invention provides a MEMS device having a structure which prevents stress from being applied to an electrode in a direction in which the electrode comes close to a movable portion when external pressure is applied to the electrode during resin transfer molding and so on. In other words, the present invention provides a MEMS device which includes a substrate and a sealing membrane, wherein:

a movable portion which vibrates mechanically, and an electrode which is positioned close to the movable portion are provided between the substrate and the sealing membrane, and the movable portion and the electrode have a region where the movable portion and the electrode overlap each other with a gap in a direction perpendicular to a surface of the substrate, a first cavity and a second cavity which are separated by the electrode are formed between the substrate and the sealing membrane, the first cavity is positioned on a side of the movable portion in the direction perpendicular to the surface of the substrate when viewed from the electrode at the region where the movable portion and the electrode overlap, the second cavity is positioned on a side opposite to the movable portion in the direction perpendicular to the surface of the substrate when viewed from the electrode at the region where the movable portion and the electrode overlap, and an inner surface of a side wall A in contact with the electrode, of the first cavity, is positioned more inside than an inner surface of a side wall B in contact with the electrode, of the second cavity, in a direction parallel to the surface of the substrate.

The MEMS device of the present invention is characterized in that:

It includes two cavities (the first cavity and the second cavity) which are sectioned by the electrode;

The inner surface of the side wall A in contact with the electrode, of the first cavity, is positioned more inside than the inner surface of the side wall B in contact with the electrode, of the second cavity, in the direction parallel to the surface of the substrate;

The first cavity is positioned on the side of the movable portion in the direction perpendicular to the surface of the substrate when viewed from the electrode at the region where the movable portion and the electrode overlap; and The second cavity is positioned on the side opposite to the movable portion in the direction perpendicular to the surface of the substrate when viewed from the electrode at the region where the movable portion and the electrode overlap. This characteristics prevents the stress in the direction in which the electrode comes close to the movable portion from being generated in the electrode even if the mechanical pressure is applied to the sealing membrane. As a result, the collision of the electrode with the movable portion is avoided, and thus the gap between the electrode and the movable portion is maintained. Further, in the MEMS device, since it is not necessary to make the sealing membrane thick to reduce the strain which is caused by the external pressure, the sealing membrane can be made to have a small thickness of 2 µm or less. The use of the sealing membrane having such small thickness contributes to the reduction in a production time of the MEMS device.

The present invention also provides a method for producing the MEMS device of the present invention which has the structure as described above. The production method of the present invention includes forming the first cavity by removing a first sacrificial layer and forming the second cavity by removing a second sacrificial layer. The removal of two sacrificial layers may be conducted in a single etching process such that the second sacrificial layer is removed firstly and then the first sacrificial layer is removed, or may be conducted in the single etching process such that the first sacrificial layer is removed firstly and then the second sacrificial layer is removed. When the first sacrificial layer is removed firstly, the materials for the first sacrificial layer and the second sacrificial layer are required to be selected such that an etching rate of the second sacrificial layer is larger than that of the first sacrificial layer, ensuring that the inner surface of side wall in contact with the electrode, of the second cavity, is positioned more outside than the inner surface of the side wall in contact with the electrode, of the first cavity, in the direction parallel to the surface of the substrate.

The MEMS device of the present invention is preferably provided in a form wherein the exterior of the sealing membrane is molded by the resin. The resin molding achieves firm sealing structure. As described above, the MEMS device of the present invention is suitable for the seal using the resin molding since the MEMS device has construction that avoids the collision of the electrode with the movable portion due to the pressure applied during the resin molding.

DESCRIPTION OF EMBODIMENTS

The embodiments of the present invention are described with reference to the drawings.

First Embodiment

Figure 1:
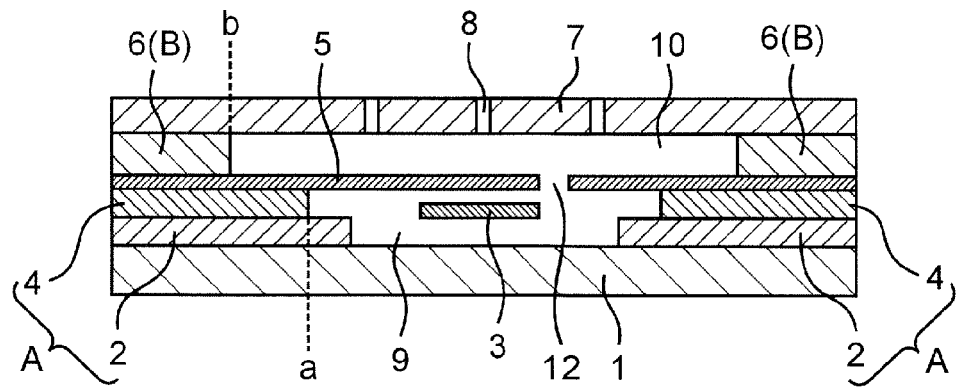
FIG. 1 is a cross-sectional view showing an example of sealing structure in a MEMS device according to a first embodiment of the present invention.

FIG. 1 is a cross-sectional view showing an example of structure of a MEMS device according to a first embodiment of the present invention. In the illustrated MEMS device, first sacrificial layers 2 and 4 consisting of two layers are formed on a substrate 1, a movable portion 3 of beam structure is formed on the lower sacrificial layer 2 in FIG. 1, and an electrode 5 is formed on the upper sacrificial layer 4. The movable portion 3 and the electrode 5 have a region where they overlap each other with a gap in the direction perpendicular to a surface of the substrate 1 (that is, a principal surface of the movable portion 3 and a principal surface of the electrode 5 are faced to each other so that they are parallel to the surface of the substrate), to construct an oscillator. The movable portion 3 has structure wherein a beam which extends in a direction vertical to paper can vibrate and ends of the beam are fixed. The movable portion 3 and the electrode 5 form electrostatic capacitance because of the micro gap. The electrostatic force which is caused by applying voltage to the electrode 5 excites vibration of the movable portion 3 at a mode of deflection, extension or torsion. Here, "the direction perpendicular to the surface of the substrate" can be said as a thickness direction of the substrate (and therefore, the device). Therefore, "the direction perpendicular to the surface of the substrate" can be said as a direction in which films are laminated in a semiconductor thin-film formation technique.

In the illustrated embodiment, when viewed from the electrode 5 at the region where the electrode 5 and the movable portion 3 overlap, the cavity which is positioned on the side of the movable portion 3 in the thickness direction of the substrate 1 is a first cavity. Therefore, the cavity which is disposed on the downside when viewed from the electrode 5, that is, a space denoted by the numeral 9 is the first cavity, in the illustrated embodiment. Here, the first cavity 9 is formed by being enclosed by the substrate 1, the first sacrificial layers 2 and 4 and the electrode 5. The first sacrificial layers 2 and 4 which are illustrated in FIG. 1 are portions which has not been removed by etching and these portions construct side walls defining side surfaces of the first cavity 9 (the surface perpendicular to the surface of the substrate). The side walls shown in FIG. 1 are side walls that contact with the electrode 5 (the side walls are denoted by "A" in FIG. 1) and are positioned on the both sides of the beam which constructs the movable portion 3 in the drawing, that is, on the side of the both edges of the beam, which edges extend in a direction parallel to the direction in which the beam extends. As illustrated in the drawing, when the sacrificial layer consists of two or more layers and the inner surfaces of the respective layers are at different positions, the position of the sacrificial layer which is closer to the electrode, that is, the sacrificial layer which contacts with the electrode (the position denoted by "a" in FIG. 1) is determined in a relationship to an inner surface of a side wall B of a second cavity.

A second sacrificial layer 6 is formed on the electrode 5 and a sealing membrane 7 is formed on the sacrificial layer 6. As described above, the first cavity is the cavity that is positioned on the side of the movable portion 3 when viewed from the electrode 5, that is, the cavity on the lower side. Thus, the second cavity is the cavity that is positioned on the side opposite to the movable portion 3, that is, the cavity on the upper side when viewed from the electrode 5. Therefore, a space denoted by the numeral 10 is the second cavity in the illustrated embodiment. Here, the second cavity 10 is formed by being enclosed by the electrode 5, the second sacrificial layer 6 and the sealing membrane 7. The second sacrificial layer 6 shown in FIG. 1 is a portion which has not been removed by etching and this portion constructs the side walls which define the side surfaces of the cavity 10. The side walls shown in FIG. 1 are side walls that contact with the electrode 5 (the side walls are denoted by "B" in FIG. 1) and are positioned on the both sides when viewed from the direction in which the beam that constructs the movable portion 3 extends. When the second sacrificial layer consists of two or more layers and the inner surfaces of the respective layers are at different positions, the position of the sacrificial layer which is closer to the electrode, that is, the sacrificial layer which contacts with the electrode (the position denoted by "b" in FIG. 1) is taken into account in determining the position of the inner surface of the side wall A of the first cavity.

Through holes 8 are formed in the sealing membrane 7. These through holes 8 are formed as etching holes at desired positions so that the cavity is formed by removing the sacrificial layer. Further, a through hole 12 is also formed in the electrode 5 for removing the first sacrificial layers 2 and 4. The first sacrificial layers 2 and 4 and the second sacrificial layer 6 may be formed from the same material or materials of a similar type. Etching may be carried out by introducing an etching gas or the like from the through holes 8 to remove the second sacrificial layer 6, and further passing the etching gas or the like through the through hole 12 to remove the first sacrificial layer 4 and the first sacrificial layer 2. In other words, the second sacrificial layer 6, the first sacrificial layer 4 and the first sacrificial layer 2 may be removed in the stated order. In that case, since the second sacrificial layer 6 is eroded simultaneously during the etching of the first sacrificial layer 4, the second cavity 10 has a larger size in a direction parallel to the surface of the substrate (a horizontal direction) than the first cavity 9. In other words, the inner surface a of the side wall A which defines the first cavity 9 is positioned more inside than the inner surface b of the side wall B which defines the second cavity 10 in the direction parallel to the surface of the substrate (in the horizontal direction.

The number and the size of the through holes 8 and the through hole(s) 12 are not limited particularly as long as they function as the etching holes in a desired manner. For example, a plurality of holes which has approximately circular shape when viewed from an upper side may be provided as the through holes 8 in the sealing membrane 7. Further, one hole or a plurality of holes having approximately circular shape or approximately rectangular shape may be provided as the through hole(s) 12 along the direction parallel to a direction in which the beam of the movable portion 3. Alternatively, an opening having a slit-like shape when viewed from the upper side may be provided as the through hole 12, across the entire electrode 5 in the direction parallel to the direction in which the movable portion 3 extends. In that case, the electrode 5 has construction of two divided portion which are bounded by the slit-like through hole 12 and both of the two portions are cantilevers which are fixed between the second sacrificial layer 6 and the first sacrificial layers 2, 4.

Figure 2:
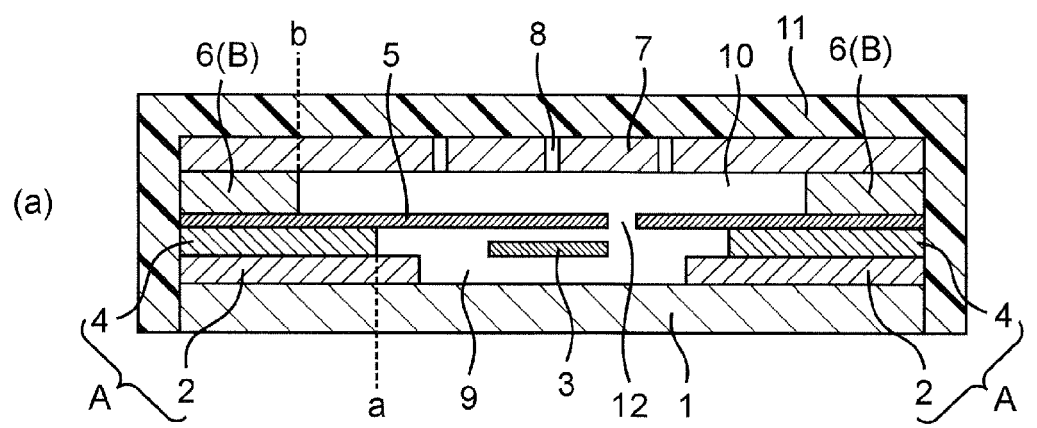
In FIG. 2, (a) to (c) are cross-sectional views showing an example of structure wherein the MEMS device according to the first embodiment of the present invention is sealed by resin molding.
Figure 2:
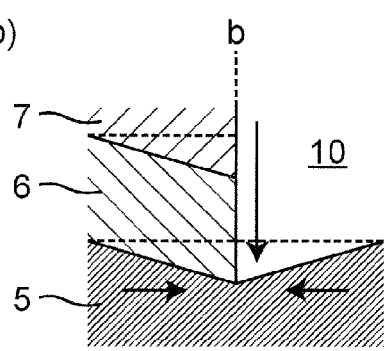
Figure 2:
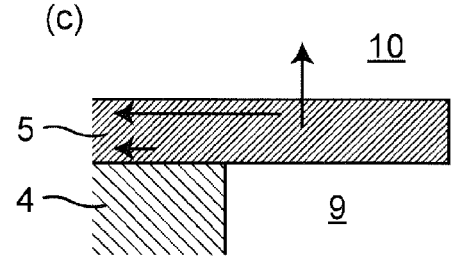

FIG. 2(a) shows an embodiment wherein the surface of the sealing membrane 7 of the MEMS device shown in FIG. 1 and the side surfaces of the device are molded with resin 11. Pressure which is applied to the sealing membrane 7 when performing the transfer molding of the resin 11 is applied to the side wall B of the second cavity as shown in FIG. 2(b) and then the side wall B pushes the electrode 5 at a contact point between the side wall B and the electrode 5. However, the electrode 5 which is pushed is deformed only in the surface side since the first sacrificial layer 4, the first sacrificial layer 2 and the substrate 1 exist as laminar structure under the electrode 5 and they are fixed. As a result, stress is caused around the contact point between the electrode 5 and the side wall B toward the contact point, whereby the surface side of the suspended (unfixed) portion of the electrode 5 is pulled toward the contact point, as shown in FIG. 2(c). Further, since the portion under the contact point between the electrode 5 and the side wall B is fixed to the side wall A of the first cavity (the first sacrificial layer 4), the stress toward the upper (in the direction away from the movable portion 3) is caused in the suspended portion of the electrode 5. The generation of such stress avoids the collision of the electrode 5 with the movable portion 3 to maintain the gap.

It is preferable to optimally determine how the inner surface a of the side wall A of the first cavity is positioned more inside relative to the inner surface b of the side wall B of the second cavity, depending on the size and the shape of the device, the positions, the shapes and the sizes of the electrode and the movable portion, mechanical stress generated in the electrode when the pressure is applied to the sealing membrane and so on. How the inner surface a of the side wall A of the first cavity is positioned more inside relative to the inner surface b of the side wall B of the second cavity is described hereinafter with the results of simulation.

Figure 12:
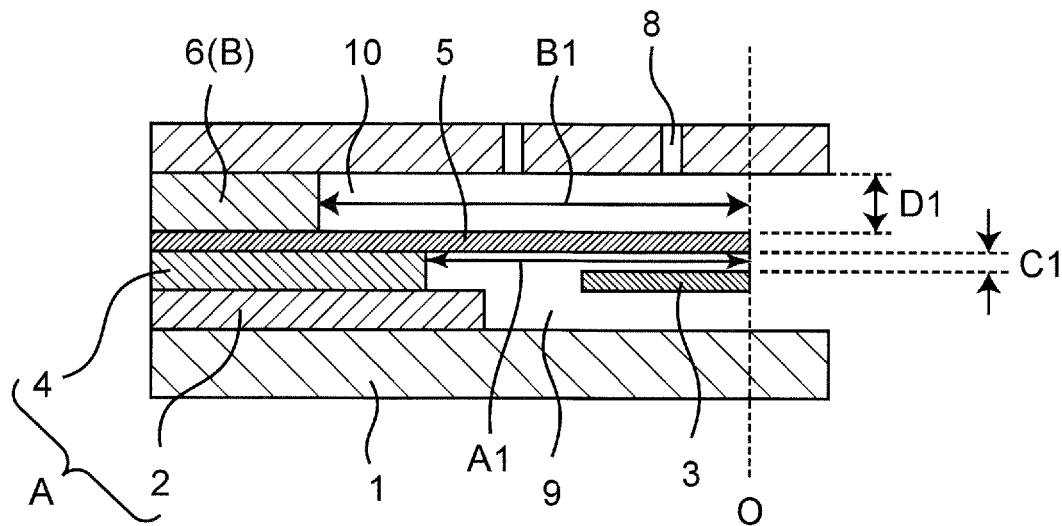
FIG. 12 is cross-sectional view showing a portion of the MEMS device shown in FIG. 1 and explaining O, A1, B1, C1, D1, E1 and F1.
Figure 13:
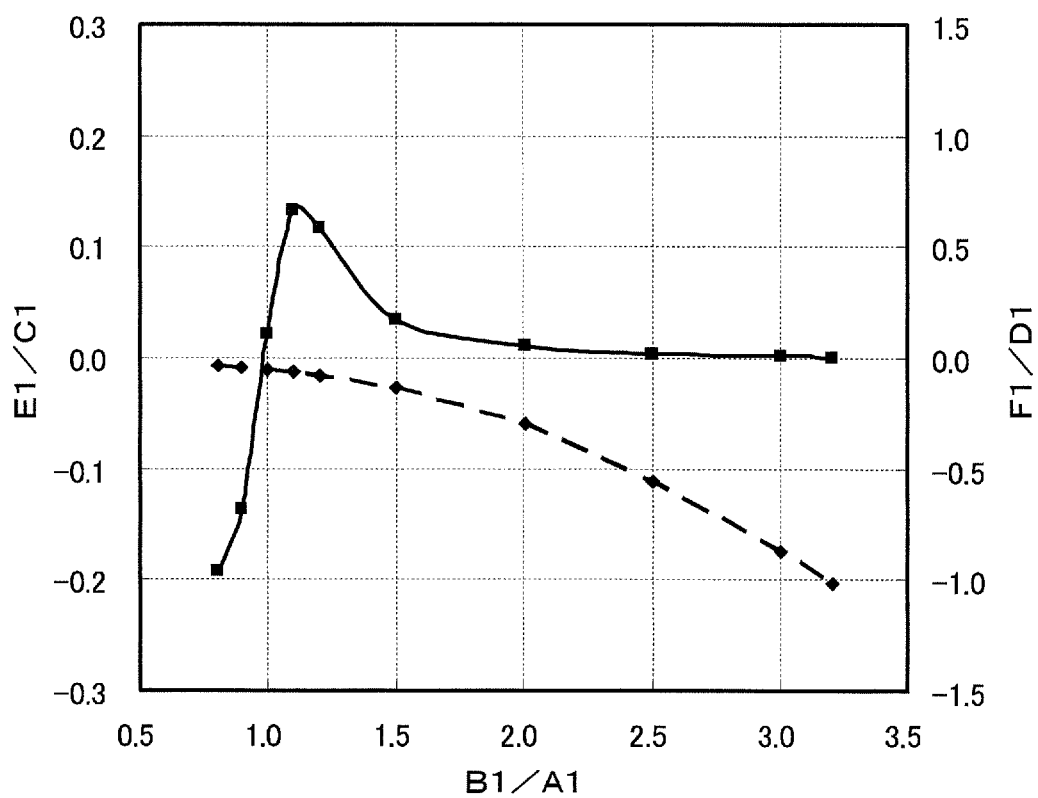
FIG. 13 is a graph showing E1/C1 and F1/D1 when B1/A1 is varied in FIG. 12.

FIG. 13 shows results showing the simulation of a maximal displacements of the electrode 5 and the sealing membrane 7 relative to the position of the side wall B of the second cavity in the thickness direction, when 100 atm as a molding pressure is applied to the thin membrane 7. FIG. 12 shows a cross-sectional view which illustrates A1 and B1 which are parameters when simulating the maximal displacements of the electrode 5 and the sealing membrane 7 in the thickness direction, and a distance C1 between the electrode 5 and the movable portion 3, and a distance D1 between the electrode 5 and the sealing membrane 7, corresponding to a portion of the cross-sectional view shown in FIG. 1.

In FIG. 12, the position denoted by "O" is a reference position of the electrode 5. Here, the "reference position of the electrode" is a position where the electrode is maximally displaced in the thickness direction of the electrode within the region opposed to the movable portion when the pressure (the molding pressure) is applied to the sealing membrane during the transfer molding to exert a force to the electrode in the thickness direction so that the electrode is displaced. Therefore, in the case where the opening 12 is the slit-like opening as in the MEMS device FIG. 1 shown in FIG. 1 and the fore-end position of the cantilever electrode which is longer one of the divided cantilever electrodes are aligned with the side edge of the movable portion, the reference position O is the fore-end position of the longer electrode (that is, the boundary between the electrode and the opening 12). When the opening 12 is of a circular shape and the electrode 5 is not divided into two portions which are bounded by the opening and the side walls B of the second cavity are positioned symmetrically relative to the movable portion 3, the position faced to the center of the movable portion 3 is determined as the reference position O. In other word, in this cross-sectional view, the fore-end of the longer cantilever shall be the reference position assuming that the electrode is divided into two cantilevers which are bounded by the opening.

"A1" is distance from the reference position O to the side wall A in the direction parallel to the surface of the substrate and perpendicular to the direction in which the beam of the movable portion 3 extends, and "B1" is distance from the reference position O to the side wall B of the second cavity in the direction parallel to the surface of the substrate and perpendicular to the direction in which the beam of the movable portion 3 extends. When the side wall A of the first cavity is not parallel to the direction in which the beam of the movable portion 3 extends (for example, the side wall A is curved when the side wall A is viewed from above), the reference position O is determined depending on the shape of the side wall A and the position of the opening 12 and A1 is accordingly determined, wherein A1 is the distance in the predetermined direction between the side wall A and the position where the electrode is maximally displaced in the thickness direction. The same is applicable to B1. "C1" is the shortest distance between the electrode 5 and the movable portion 3 in the direction perpendicular to the surface of the substrate. "D1" is the shortest distance between the electrode 5 and the sealing membrane 7 in the direction perpendicular to the surface of the substrate.

The simulation was made determining E1/C1 and F1/D1 by calculation wherein "E1" is the maximal displacement of the electrode 5 in the direction perpendicular to the surface of the substrate (that is, the thickness direction) and "F1" is the displacement of the sealing membrane 7 in the direction perpendicular to the surface of the substrate (that is, the thickness direction) when B1/A1 is varied. In FIG. 12, a lateral axis denotes B1/A1 and a vertical axis (a left-side axis) denotes E1/C1 and a vertical axis (a right-side axis) denotes F1/D1. A solid line (the left-side axis) shows the maximal displacement of the electrode in the thickness direction when the positional relationship between the sidewalls of the first cavity and the second cavity is changed and a broken line (the right-side axis) shows the maximal displacement of the sealing membrane 7 in the thickness direction when the positional relationship between the sidewalls of the first cavity and the second cavity is changed. Here, when E1/C1 (the left-side axis) is in the positive region, it means that the electrode 5 is being away from the movable portion 3. When E1/C1 is in the negative region, the electrode 5 is being close to the movable portion 3. Accordingly, E1/C1=−1.0 means that the electrode 5 contacts with the movable portion 3. Similarly, when F1/D1 (the right axis) is in the positive region, the sealing membrane 7 is being away from the electrode 5. When F1/D1 is in the negative region, the sealing membrane 7 is being close to the electrode 5. Accordingly, F1/D1=−1.0 means that the sealing membrane 7 contacts with the electrode 5.

When B1/A1 (the lateral axis) is 1.0, that is, A1=B1, the position of the side wall A of the first cavity coincides with the position of the side wall B of the second cavity. Accordingly, B1/A1>1.0 means that the side wall A of the first cavity is positioned more inside than the side wall B of the second cavity, and B1/A1<1.0 means that that the side wall A of the first cavity is positioned more outside than the side wall B of the second cavity.

It was confirmed, from the results of the simulation shown in FIG. 12, E1/C1 (the solid line) is 0 or more positive value in the region where B1/A1 is more than 1.0. In other words, the gap was able to be maintained between the electrode 5 and the movable portion 3 or the electrode 5 was able to be away from the movable portion 3, by disposing the side wall A of the first cavity more inside than the side wall B of the second cavity. However, the position of the inner surface b of the side wall B is preferably more outside by 0.1 μm than the position of the inner surface a of the side wall A, considering the positional accuracy of a mask for the through holes (etching holes) and the variation in etching.

Further, E1/C1 shows a peak when B1/A1 being around 1.1 and E1/C1 comes close to almost zero when B1/A1≥1.5. This shows that, as shown in FIGS. 2(b) and (c), the surface of the electrode is deformed near the contact point between the electrode 5 and the side wall B and the effect of exerting the stress on the electrode 5 in the direction in which the reference position O of the electrode 5 is away from the movable portion 3 is significant between B1/A1=1.0 and B1/A1=1.5.

FIG. 12 shows that the stress exerted on the electrode 5 is small when B1/A1 is 1.5 or more, resulting in that the reference position O of the electrode 5 is hardly displaced in the thickness direction. In other words, when B1/A1 is 1.5 or more and a molding pressure is applied to the sealing membrane 7, the distance between the electrode 5 and the movable portion 3 is hardly changed from the distance when the molding pressure is not applied to the sealing membrane 7. This means that, when B1/A1≥1.5, the gap between the electrode 5 and the sealing membrane 7 can be maintained at a constant level irrespective of the application of the molding pressure. Therefore, B1/A1 is preferably 1.5 or more. This is because difference can be made small or eliminated between a value of the gap between the electrode and the sealing membrane during the application of the molding pressure and the designed value of the gap.

F1/D1 which is denoted by a broken line is in the negative region smaller than zero irrespective of the value of B1/A1. This means that the sealing membrane 7 is displaced by the application of the molding pressure irrespective of the position of the side wall A of the first cavity relative to the position of the side wall B of the second cavity. Further, it is found that, as the B1/A1 is larger, the sealing membrane 7 is more deformed in the direction in which the sealing membrane 7 is close to the electrode 5, according to FIG. 12. Further, FIG. 12 shows that F1/D1 is −1.0, that is, the sealing membrane 7 contacts with the electrode 5 when the value of B1/A1 is around 3.2. The resonator operation cannot be ensured when the sealing membrane 7 contacts with the electrode 5. Therefore, B1/A1 is preferably 3.2 or less.

Further, when the size of the second cavity 10 is large irrespective of the size of the first cavity, the sealing membrane may be bent to contact with the electrode and/or the movable portion 3 upon the resin transfer molding. Therefore, the size of the second cavity and thus the position of the inner surface of the side wall B are preferably determined considering the gap between the electrode 5 or the movable portion 3 and the sealing membrane 7, and Young's modulus and the film thickness of the sealing membrane 7, to the extent that the sealing membrane 7 does not contact with the electrode 5 and/or the movable portion 3 when applying a pressure of about 100 atm to about 150 atm.

For example, when the sealing membrane 7 is constructed from SiGe having a thickness of 10 μm or less and the gap between the electrode 5 and the sealing membrane 7 is 1 μm and the width of the second cavity 10 (the dimension in the x direction assuming that the surface of the substrate 1 is a x-y coordinate plane and the y direction is parallel to the direction in which the beam of the movable portion 3 extends) is about 200 μm, the sealing membrane 7 contacts with the electrode 5 and/or the movable portion 3 under the molding pressure of 100 atm to 150 atm. Therefore, the position of the inner surface of the side wall B in the MEMS device of such structure is preferably determined so that the width of the second cavity is less than 200 μm.

In the MEMS device shown in FIG. 1, the side wall A defining the first cavity 9 is formed of two layers having a step. This is caused due to the production procedures wherein, for example, a SOI substrate is used and no etching stop is provided, as described below. In a variation of the MEMS device shown in FIG. 1, the inner surfaces of two first sacrificial layers may be at the same position. Alternatively, the inner surface of the lower first sacrificial layer 2 may be positioned more outside than the inner surface of the upper first sacrificial layer 4 in the direction parallel to the surface of the substrate.

In the MEMS device of the present invention, it is required that the inner surface of a side wall in contact with the electrode, of the side walls defining the first cavity, is positioned more inside than the inner surface of the side wall in contact with the electrode, of the second cavity, in the direction parallel to the surface of the substrate. It should be noted that, in the MEMS device shown in FIG. 1, the side wall A in contact with the electrode, of the first cavity and the side wall B in contact with the electrode, of the second cavity, are positioned on both sides of the beam of the movable portion 3, and in parallel to the extension direction of the beam when the cavity shown in FIG. 1 has an approximately rectangular shape when viewed from above. Therefore, the other side walls, for example, the side wall of the first cavity, which side wall is positioned along the direction almost parallel to the direction perpendicular to the extension direction of the beam of the movable portion 3 (along the right to left direction in FIG. 1) and is not shown in FIG. 1 when the cavity has an approximately rectangular shape when viewed from above in the MEMS device illustrated in FIG. 1, may be positioned more outside or inside than the inner surface of the side wall of the second cavity, which side wall is positioned along the direction perpendicular to the extension direction of the beam of the movable portion 3. However, when the MEMS device of the present invention is produced using a process described below, the inner surface of the entire side wall of the first cavity is generally positioned more inside than the inner surface of the entire side wall of the second cavity.

Figure 3:
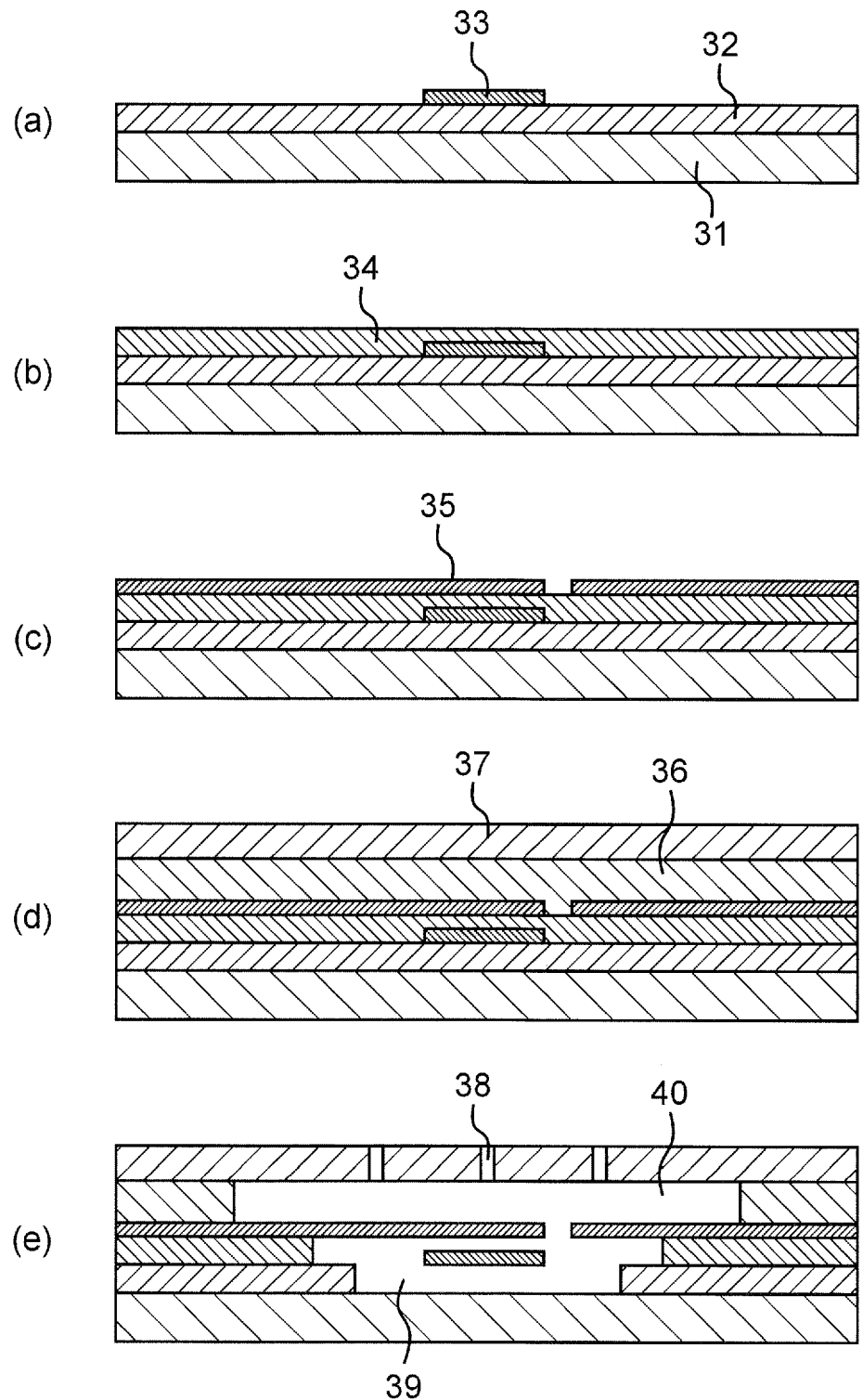
In FIG. 3, (a) to (e) are cross-sectional views showing a process flow of a method for producing the MEMS device according to the first embodiment of the present invention.

FIG. 3 is a process flow diagram showing an example of a production method of the MEMS device of FIG. 1. Firstly, as shown in FIG. 3(a), a SOI substrate is prepared, which is formed from a silicon substrate 31, a BOX layer (a buried silicon oxide film) 32 corresponding to "2" in FIG. 1 and a single crystal silicon layer 33 corresponding to "3" in FIG. 1. Patterning is made in the single crystal silicon layer 33 by conducting a photolithography step and an etching step in this SOI substrate. Next, a silicon oxide film 34 corresponding to "4" in FIG. 1 is formed as shown in FIG. 3(b). Next, a metal material such as Pt or Al, or porous silicon is formed into a thin film as an electrical conductive layer 35 corresponding to "5" in FIG. 1, and then the film is subjected to patterning by the photolithography step and the etching step so that the electrical conductive layer 35 having a desired pattern is obtained as shown in FIG. 3(c).

Further, as shown in FIG. 3(d), a silicon oxide layer corresponding to "6" in FIG. 1 and a film 37 of a material for forming the sealing membrane corresponding to "7" in FIG. 1 are sequentially formed on the electrical conductive layer 35. Here, the material for forming the membrane 37 is selected from, for example, porous silicon, Pt, Al and $Al_2O_3$ which have durability in the sacrificial-layer removing step. Finally, the through holes 38 corresponding to "8" in FIG. 1 are opened in the film 37 by the photolithography step and the etching step and an etching gas or an etchant is introduced from the through holes to remove desired regions of the silicon oxide film 36, the silicon oxide film 34 and the BOX layer 32 sequentially. The structure of FIG. 1 is achieved by carrying out the above steps. This production method can form the first cavity and the second cavity in a single etching process without specific control so that the inner surface of the entire side wall of the first cavity is positioned more inside than the inner surface of the entire side wall of the second cavity in the direction parallel to the surface of the substrate, even if the films 36, 34 and 32 are formed from the same material or different materials of a similar type.

The first cavity 9 and the second cavity 10 are may be sealed by covering the surface of the sealing membrane 7 (37) with a thin film or the like after removing the desired amounts of the first sacrificial layers 2 (32) and (34) and the second sacrificial layer 6 (36) by introducing the etching gas or the like from the through holes 8 (38) followed by capping the through holes, although this is not shown in FIGS. 1 and 3.

When the MEMS device is produced using a semiconductor process, the same structure may be obtained by various techniques. Therefore, it should be noted that the production method of the MEMS device of the present invention is not limited to the flow shown in FIG. 3.

Embodiment 2

Figure 4:
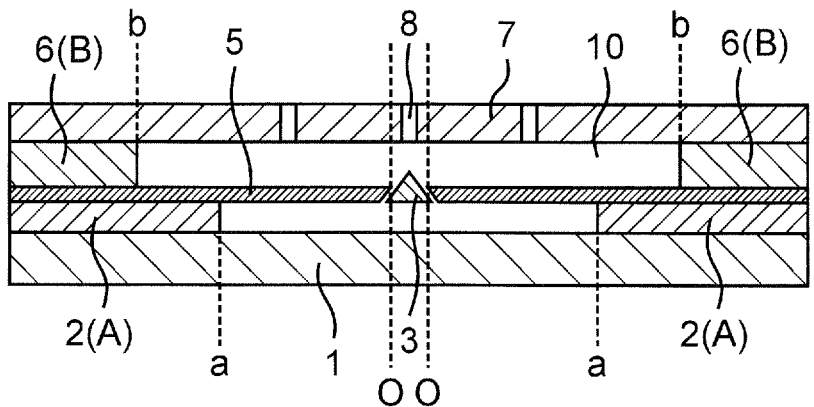
FIG. 4 is a cross-sectional view showing an example of sealing structure in a MEMS device according to a second embodiment of the present invention.

FIG. 4 is a cross-sectional view of a structural example of a MEMS device according to a second embodiment of the present invention. The MEMS device shown in FIG. 1 is of structure which has a region in which the plate-like electrode and the plate-like movable portion overlap each other with a gap in the direction perpendicular to the surface of the substrate and the principal surfaces of the electrode and the movable portion are parallel to each other. In contrast, the MEMS device shown in FIG. 4 is provided with the movable portion 3 having a beam having triangular cross-section structure (that is, a triangular-prism beam) and has structure wherein a side surface of the electrode is opposed to a slope of the triangular movable portion 3. Also in this MEMS device, the movable portion 3 and the electrode 5 have a region wherein they overlap each other with a gap in the direction perpendicular to the surface of the substrate (the bevel of the movable portion 3 and the side surface of the electrode 5 parallel to the bevel). In the MEMS device shown in FIG. 4, the movable portion 3 side when viewed from the electrode 5 is the lower side (when the electrode 5 is pushed downward, it contacts with the movable portion 3). Therefore, the first cavity 9 and the second cavity 10 are the spaces which are positioned at the lower side and the upper side respectively when viewed from the electrode 5. The inner surface a of the side wall A of the first cavity is positioned more inside than the inner surface b of the side wall B of the second cavity in the direction parallel to the surface of the substrate, similarly to the MEMS device of FIG. 1. The effect given by this side-wall structure is as described with reference to FIG. 1.

In the MEMS device shown in FIG. 4, the side wall A defining the first cavity 9 is constructed of a single sacrificial layer. This is because the MEMS device is produced by a method wherein the movable portion 3 of single crystal silicon is formed using a SOI substrate and then a layer which is to be the electrode is formed on a surface of a BOX layer. The other elements are as described in connection with the first embodiment and therefore the descriptions thereof are omitted here.

In the MEMS device shown in FIG. 4, the electrode 5 is formed left-right symmetrically in the drawing (symmetrically in the direction perpendicular to direction in which beam of the movable portion 3 extends and perpendicular to the thickness direction) relative to the movable portion 3. Thus, the reference position of the electrode 5 for determining A1 and B1 which are described with reference to FIGS. 12 and 13 in connection with the first embodiment is the position where the upper edge of the electrode 5 passes through as shown in FIG. 4.

Two types of the MEMS devices are described above, wherein the movable portions have different shapes. The present invention is similarly applied to the structure which has a region where the electrode and the movable portion overlap each other with a micro gap in the direction perpendicular to the surface of the substrate.

Third Embodiment

Figure 5:
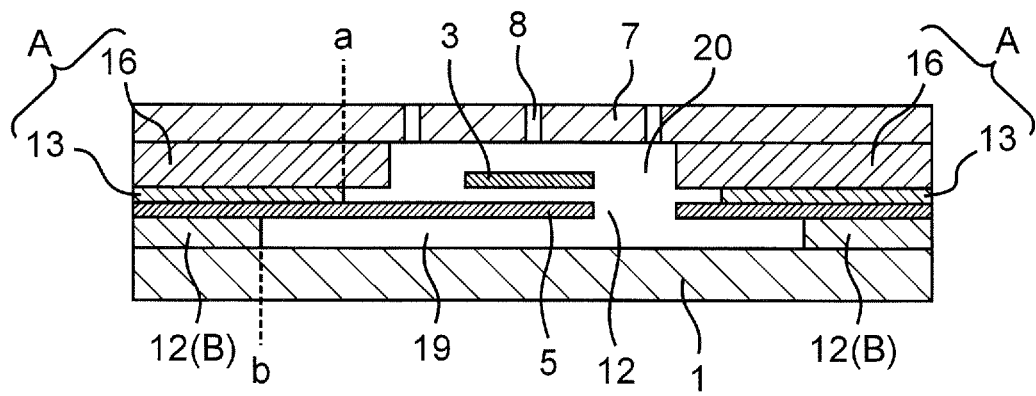
FIG. 5 is a cross-sectional view showing an example of sealing structure in a MEMS device according to a third embodiment of the present invention.

FIG. 5 is a cross-sectional view showing a structural example of a MEMS device according to a third embodiment of the present invention. In the illustrated MEMS device, a second sacrificial layer 12 is formed on a substrate 1 and an electrode 5 is formed on the second sacrificial layer 12 and a movable portion 3 is provided above the electrode 5 and first sacrificial layers 13, 16 are formed on the electrode 5. In the illustrated embodiment, a sealing membrane 7 is provided on the first sacrificial layer 16.

The electrode 5 and the movable portion 3 have a region where they overlap each other with a micro gap in the direction perpendicular to the surface of the substrate 1 (that is, the principal surface of the electrode 5 and the principal surface of the movable portion 3 are opposed to each other, being parallel to the surface of the substrate in the illustrate embodiment), constructing an oscillator. The movable portion 3 and the electrode 5 form electrostatic capacitance by the micro gap and electrostatic force generated by applying voltage to the electrode 5 excites vibration of the movable portion 3 at a mode of deflection, extension or torsion.

In FIG. 5, the movable-portion 3 side when viewed from the electrode 5 is the upper side of the electrode 5. Therefore, the cavity positioned on the upper side when viewed from the electrode 5, that is, a space denoted by a numeral "20" is the first cavity 20 in the illustrated embodiment. Here, the first cavity 20 is formed by being enclosed by the electrode 5, the first sacrificial layers 13, 16 and the sealing membrane 7. The sacrificial layers 13, 16 shown in. FIG. 5 are portions which have not been removed by etching. As described in connection with the first embodiment, the position of the inner surface of the side wall A which is of the first sacrificial layer 13 and in contact with the electrode 5 (the position denoted by "a"), of the side walls defining the first cavity 20, is determined in the relationship with the position of the inner surface b of the side wall B of the second cavity described below.

In FIG. 5, the cavity which is positioned at lower side when viewed from the electrode 5, that is, the space denoted by a numeral "19" is the second cavity. Here, the second cavity 19 is formed by being enclosed by the substrate 1, the second sacrificial layer 12 and the electrode 5. The side wall B defining the second sacrificial layer 19 is the second sacrificial layer 12 and is a portion which has not been removed by etching. How the inner surface of the side wall A of the first cavity is positioned more inside than the inner surface of the side wall B of the second cavity is determined considering the mechanical stress which is generated in the electrode 5 when the mechanical pressure is applied to the sealing membrane 7, so that the gap between the electrode 5 and the movable portion 3 is maintained when the mechanical pressure is applied to the sealing membrane 7, as described with reference to FIGS. 1, 2 and 13.

Through holes 8 are formed in the sealing membrane 7. These through holes 8 are formed as etching holes at desired positions since the cavities are formed by removing the sacrificial layers. In the production of the MEMS device of the embodiment shown in FIG. 5, the first sacrificial layers 13, 16 and the second sacrificial layer are formed of materials presenting different etching rates during the removal of the sacrificial layers. Specifically, the materials for the respective sacrificial layers are selected so that the etching rate of the second sacrificial layer 12 is larger than that of each of the first sacrificial layers 13, 16. As a result, the etching gas or the etchant introduced from the through holes 8 removes the first sacrificial layers 16, and then passes through the opening portion 12 to remove the first sacrificial layer 13 and the second sacrificial layer 12 sequentially, whereby the second cavity 19 has a larger dimension than the first cavity 20 in the direction parallel to the surface of the substrate. In other words, the inner surface a of the side wall A defining the first cavity 20 is positioned more inside than the inner surface b of the second cavity 19 defining the side wall B in the direction parallel to the surface of the substrate.

When the MEMS device of such construction is sealed by resin transfer molding of resin as shown in FIG. 2(a), the pressure applied to the sealing membrane 7 passes through the side wall A and then pushes the electrode 5 at a contact point between the lower first sacrificial layer 13 and the electrode 5. Since a hollow is formed under the electrode 5 at the contact point between the side wall A and the electrode 5, the electrode 5 is pushed downwardly. Thus, a stress component which acts in the direction toward a side opposite to the movable portion 3 is generated in the electrode 5, resulting in avoidance of collision of the electrode 5 with the movable portion 3. In other words, when the molding pressure is applied to the sealing membrane 7 in the structure of FIG. 5, the sealing membrane 7 and the electrode 5 are displaced integrally with the behavior shown by the broken line in FIG. 12. Thus, the electrode 5 is displaced in the direction away from the movable portion 3 by disposing the side wall A of the first cavity at inner position compared to the side wall B of the second cavity.

Figure 6:
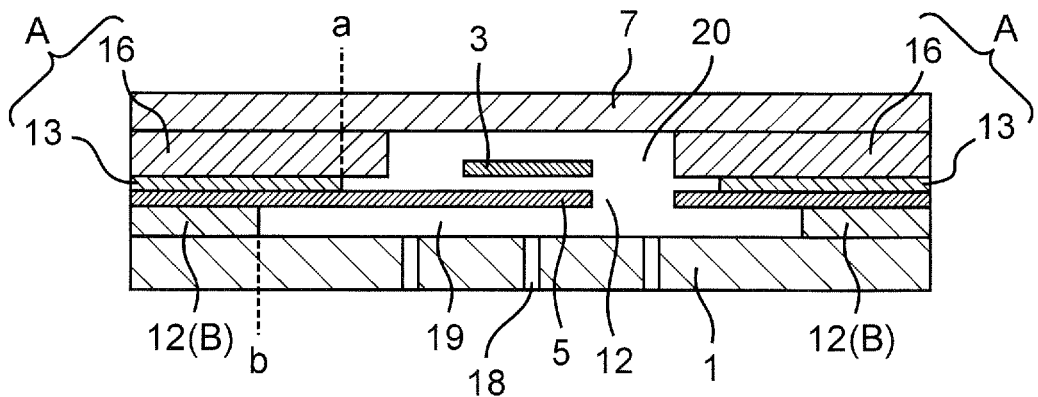
FIG. 6 is a cross-sectional view showing another example of sealing structure in the MEMS device according to the third embodiment of the present invention, wherein through holes are formed in a substrate.
Figure 7:
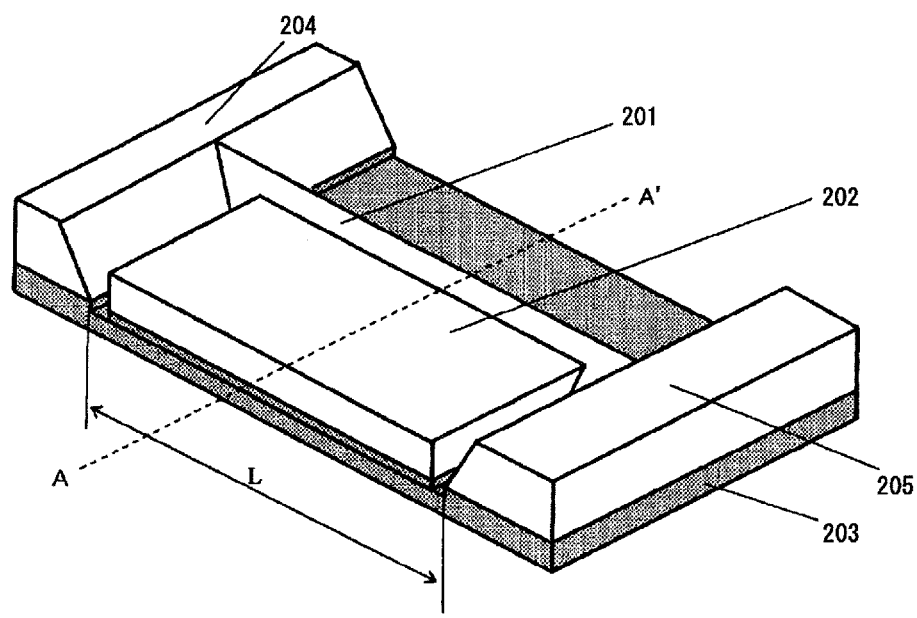
FIG. 7 is a perspective view of a conventional triangular-beam torsional resonator.
Figure 8:
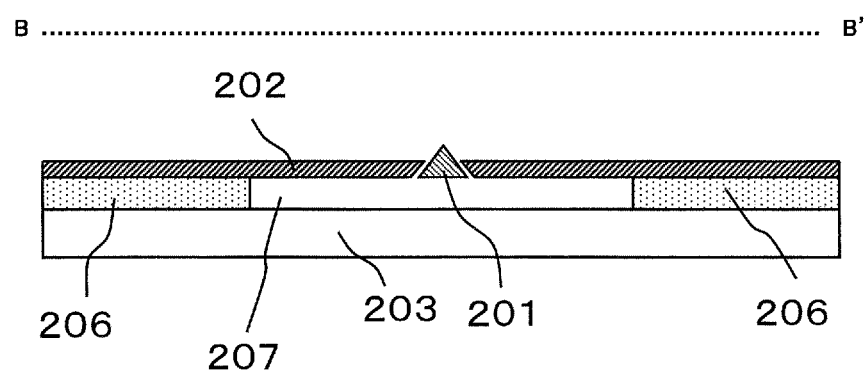
FIG. 8 is a cross-sectional view of the conventional triangular-beam torsional resonator.
Figure 9:
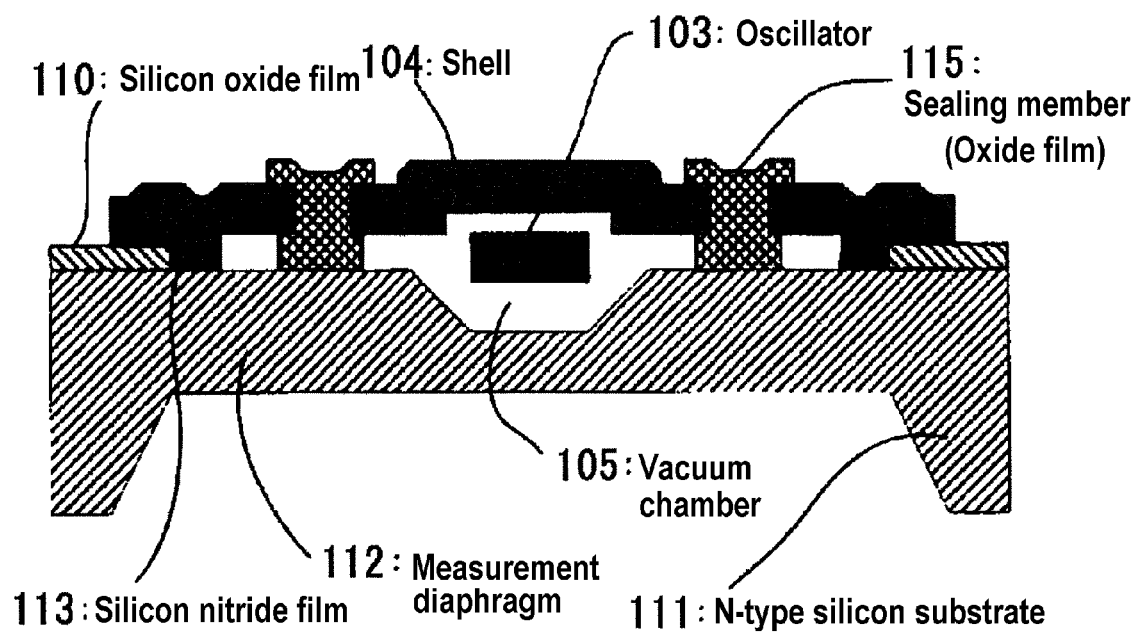
FIG. 9 is a cross-sectional view showing sealing structure of a conventional MEMS device.
Figure 10:
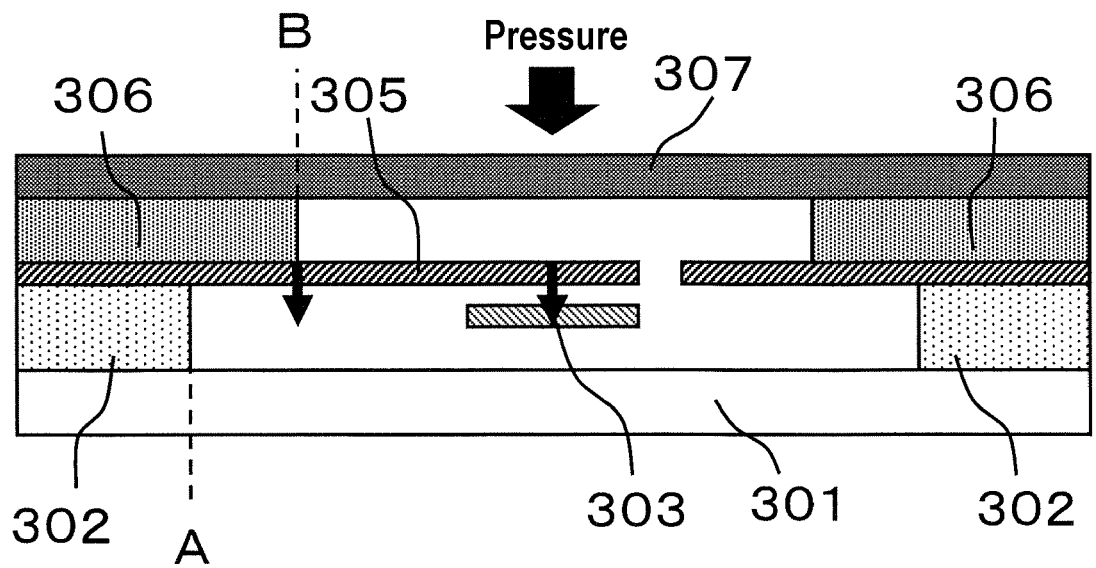
FIG. 10 is a cross-sectional view showing membrane sealing structure of a conventional MEMS device.
Figure 11:
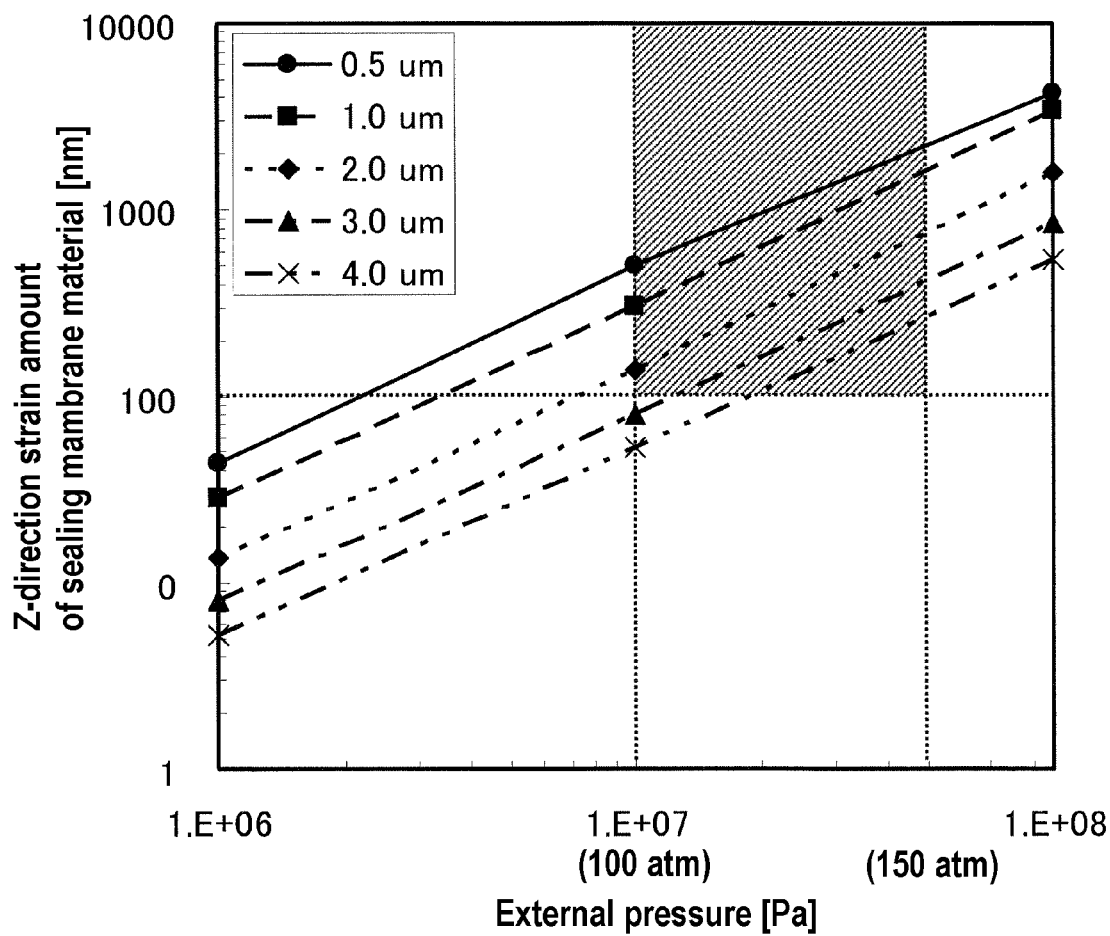
FIG. 11 is a graph showing relationship between external pressure applied to the sealing membrane and strain in the sealing membrane in a thickness direction.

FIG. 6 is another structural example of a MEMS device according to the third embodiment of the present invention. The MEMS device shown in FIG. 6 is different from the MEMS device shown in FIG. 5 in that the through holes 18 are formed in the substrate 1, as the etching holes for forming the cavity by removal of the sacrificial layer. Further, the sacrificial layers 13, 16 and the second sacrificial layer 12 are formed from the same material or materials of a similar type in this embodiment. The MEMS device of this embodiment can be produced by a method wherein the etching gas or the etchant is introduced from the through holes 18 to remove the second sacrificial layer 12, the first sacrificial layer 13 and the first sacrificial layer 16 in the stated order.

The introduction of the etching gas or the like from the through holes 18 results in exposure of the sacrificial layer 12 to the etching gas or the like in a longer period of time. For this reason, the second cavity 19 has a dimension larger than that of the first cavity 20 in the direction parallel to the surface of the substrate even when all the sacrificial layers are made from the same material. In other words, the inner surface a of the side wall A defining the cavity 20 is positioned more inside than the inner surface b of the side wall B defining the second cavity 19 in the direction parallel to the surface of the substrate. This avoids the collision of the electrode 5 with the movable portion 3 following the mechanism described with reference to FIG. 5 in the case where the surface of the sealing membrane 7 and the side surfaces of the MEMS device are sealed by resin molding.

The through holes 8 may be capped by covering the surface of the sealing membrane 7 with a thin film to seal the first cavity 20 and the second cavity 19 after the desired amounts of the first sacrificial layers 13, 16 and the second sacrificial layer 12 are removed by the introduction of the etching gas from the through holes 8, although such capping is not shown in FIG. 5. Similarly, the through holes 18 may be capped by covering the surface (the exposed surface which is positioned on the lower side in the FIG. 6) of the substrate 1 with the thin film to seal the first cavity 20 and the second cavity 19 after the desired amounts of the first sacrificial layers 13, 16 and the second sacrificial layer 12 are removed by the introduction of the etching gas from the through holes 18, although such capping is not shown in FIG. 6.

In FIGS. 5 and 6, the inner surface of the first sacrificial layer 16 is positioned more inside than the inner surface of the first sacrificial layer 13 in the direction parallel to the surface of the substrate. When the first sacrificial layer consists of two or more layers, the positional relationship among the inner surfaces of those layers is not limited particularly. For example, in each of the MEMS devices shown in FIG. 5 and FIG. 6, the inner surface of the upper first sacrificial layer 16 may be positioned more outside than that of the lower first sacrificial layer 13 in the direction parallel to the surface of the substrate as long as the inner surface a of the side wall A of the first sacrificial layer 13 which contacts with the electrode 5 is positioned more inside than the inner surface b of the side wall B of the second sacrificial layer 12 in the direction parallel to the surface of the substrate.

In each of FIGS. 5 and 6, the structure is shown, wherein the principal surfaces of the electrode and the movable portion are vertical to the surface of the substrate and parallel to each other. A variation of the embodiments shown in FIGS. 5 and 6 may have another structure which has region wherein the electrode and the movable portion overlap each other with a gap in the direction perpendicular to the surface of the substrate.

INDUSTRIAL APPLICABILITY

The MEMS device according to the present invention is provided with the electrode and the movable portion which have a region where they overlap each other with a gap in the direction perpendicular to the surface of the substrate, and achieves high reliability in that the collision of the electrode with the movable portion is avoided when the mechanical pressure is applied during the resin molding after the sealing is made with the sealing membrane. Therefore, the MEMS device of the present invention can be applied to devices such as a switching device, a resonator, a filter, an oscillator, a gyroscope, a pressure sensor, and a mass-detection device and electronic devices using the aforementioned devices.

DESCRIPTION OF SYMBOLS

1 Substrate
2, 4, 6, 12, 13, 16 Sacrificial layer
3 Movable portion (beam)
5 Electrode
7 Sealing membrane
8, 18 Through hole (Etching hole)
9, 10, 19, 20 Cavity
11 Resin
A Side wall defining first cavity
B Side wall defining second cavity
a Inner surface of side wall A
b Inner surface of side wall B

The invention claimed is:

1. A MEMS device comprising a substrate and a sealing membrane, wherein:
a movable portion of beam structure which vibrates mechanically, and an electrode which is positioned close to the movable portion are provided between the substrate and the sealing membrane, and the movable portion and the electrode have a region where the movable portion and the electrode overlap each other with a gap in a direction perpendicular to a surface of the substrate,
a first cavity and a second cavity which are separated by the electrode are formed between the substrate and the sealing membrane,
the first cavity is positioned on a side of the movable portion in the direction perpendicular to the surface of the substrate when viewed from the electrode at the region where the movable portion and the electrode overlap,
the second cavity is positioned on a side opposite to the movable portion in the direction perpendicular to the surface of the substrate when viewed from the electrode at the region where the movable portion and the electrode overlap, and $B1/A1 \geq 1.0$ in which A1 is distance between an inner surface of a side wall A in contact with the electrode, of the first cavity, and a reference position O in the direction parallel to the surface of the substrate and perpendicular to the direction of the beam constituting the movable portion,
B1 is distance between an inner surface of a side wall B in contact with the electrode, of the second cavity, and the reference position O in the direction parallel to the surface of the substrate and perpendicular to the direction of the beam constituting the movable portion, and
the reference position O is a position where the electrode is maximally displaced in the direction perpendicular to the surface of the substrate at a region where the electrode and the movable portion are faced to each other perpendicular to the surface of the substrate when force is exerted to the electrode in the direction perpendicular to the surface of the substrate.

2. The MEMS device according to claim 1, wherein the inner surface of the side wall of the first cavity is disposed at a position that is determined considering mechanical stress which is generated in the electrode when mechanical pressure is applied to the sealing membrane, so that the gap between the electrode and the movable portion is maintained when the mechanical pressure is applied to the sealing membrane.

3. The MEMS device according to claim 1, wherein:

$B1/A1 \geq 1.5$.

4. The MEMS device according to claim 1, wherein:

$B1/A1 \leq 3.2$.

5. The MEMS device according to claim 1, wherein the inner surface of the entire side wall of the first cavity is positioned more inside than the inner surface of the entire side wall of the second cavity, in the direction parallel to the surface of the substrate.

6. The MEMS device according to claim 1, wherein the first cavity is formed by removing a first sacrificial layer and the second cavity is formed by removing a second sacrificial layer.

7. The MEMS device according to claim 6, wherein the second cavity and the first cavity are formed by removing the second sacrificial layer firstly and then the first sacrificial layer in a single etching process.

8. The MEMS device according to claim 6, wherein the first sacrificial layer and the second sacrificial layer are formed from different materials, and the materials of the respective sacrificial layers are selected such that an etching rate of the second sacrificial layer is larger than an etching rate of the first sacrificial layer, and the first cavity and the second cavity are formed by removing the first sacrificial layer firstly and then removing the second sacrificial layer in a single etching process.

9. The MEMS device according to claim 1, wherein outside of the sealing membrane is molded with a resin.

10. A MEMS oscillator which comprises the MEMS device according to claim 1.

11. An electronic device which comprises the MEMS oscillator according to claim 10.

12. An electronic device which comprises the MEMS device according claim 1.

13. A method for producing a MEMS device which includes a substrate and a sealing membrane, wherein:
a movable portion of beam structure which vibrates mechanically, and an electrode which is positioned close to the movable portion are provided between the substrate and the sealing membrane, and the movable portion and the electrode have a region where the movable portion and the electrode overlap each other with a gap in a direction perpendicular to a surface of the substrate,
a first cavity and a second cavity which are separated by the electrode are formed between the substrate and the sealing membrane,
the first cavity is positioned on a side of the movable portion in the direction perpendicular to the surface of the substrate when viewed from the electrode at the region where the movable portion and the electrode overlap, the second cavity is positioned on a side opposite to the movable portion in the direction perpendicular to the surface of the substrate when viewed from the electrode at the region where the movable portion and the electrode overlap, and $B1/A1 \geq 1.0$ in which A1 is distance between an inner surface of a side wall A in contact with the electrode, of the first cavity, and a reference position O in the direction parallel to the surface of the substrate and perpendicular to the direction of the beam constituting the movable portion, B1 is distance between an inner surface of a side wall B in contact with the electrode, of the second cavity, and the reference position O in the direction parallel to the surface of the substrate and perpendicular to the direction of the beam constituting the movable portion, and the reference position O is a position where the electrode is maximally displaced in the direction perpendicular to the surface of the substrate at a region where the electrode and the movable portion are faced to each other perpendicular to the surface of the substrate when force is exerted to the electrode in the direction perpendicular to the surface of the substrate, which method comprises:

forming the first cavity by removing a first sacrificial layer, and forming the second cavity by removing a second sacrificial layer.

14. The method for producing the MEMS device according to claim 13, wherein forming the first cavity and forming the second cavity are conducted in a single etching process, and the second sacrificial layer is firstly removed and then the first sacrificial layer is removed in the single etching process.

15. The method for producing the MEMS device according to claim 13 which further comprises selecting the materials for the first sacrificial layer and the second sacrificial layer such that an etching rate of the second sacrificial layer is larger than an etching rate of the first sacrificial layer, wherein forming the first cavity and forming the second cavity are conducted in a single etching process, and the first sacrificial layer is firstly removed and then the second sacrificial layer is removed in the single etching process.

* * * * *